United States Patent
Brennan et al.

(10) Patent No.: US 9,521,776 B1
(45) Date of Patent: Dec. 13, 2016

(54) CHASSIS RAIL STABILIZER

(71) Applicant: VCE Company, LLC, Richardson, TX (US)

(72) Inventors: Paul E. Brennan, Sutton, MA (US); Mark Steven Tuck, Allen, TN (US)

(73) Assignee: VCE IP Holding Company LLC, Richardson, TX (US)

(*) Notice: Subject to any disclaimer, the term of this patent is extended or adjusted under 35 U.S.C. 154(b) by 161 days.

(21) Appl. No.: 14/134,739

(22) Filed: Dec. 19, 2013

(51) Int. Cl.
*H05K 7/18* (2006.01)

(52) U.S. Cl.
CPC .............. *H05K 7/18* (2013.01); *H05K 7/183* (2013.01); *H05K 7/186* (2013.01)

(58) Field of Classification Search
CPC ........... H05K 7/18; H05K 7/183; H05K 7/186
USPC ................................... 211/26, 26.2
See application file for complete search history.

(56) References Cited

U.S. PATENT DOCUMENTS

| | | | | |
|---|---|---|---|---|
| 5,791,498 A * | 8/1998 | Mills | ...................... | H02B 1/34 211/183 |
| 6,270,281 B1 * | 8/2001 | Ruusuvuori | ......... | H05K 7/1425 211/182 |
| 6,746,193 B1 * | 6/2004 | Drake | .................... | F16B 37/043 211/182 |
| 7,552,899 B2 * | 6/2009 | Chen | .................... | A47B 88/044 211/26 |
| 7,699,279 B2 * | 4/2010 | Chen | .................... | A47B 88/044 248/220.22 |
| 7,731,142 B2 * | 6/2010 | Chen | .................... | A47B 88/044 248/244 |
| 7,798,581 B2 * | 9/2010 | Chen | ........................ | G06F 1/183 211/26 |
| 7,857,145 B2 * | 12/2010 | Mushan | ............... | A47B 88/044 211/26 |
| 7,878,468 B2 * | 2/2011 | Chen | .................... | A47B 88/044 211/26 |
| 7,950,753 B2 * | 5/2011 | Liang | ................... | A47B 88/044 211/26 |
| 8,371,454 B2 * | 2/2013 | Chen | .................... | A47B 88/044 211/26 |
| 8,596,471 B2 * | 12/2013 | Chen | .................... | H05K 7/1421 211/153 |
| 8,602,225 B2 * | 12/2013 | Lin | ...................... | A47B 88/044 211/26 |
| 8,807,351 B2 * | 8/2014 | Lin | ...................... | A47B 88/044 211/26 |
| 8,967,565 B2 * | 3/2015 | Chen | .................... | A47B 88/044 211/192 |
| 8,967,567 B2 * | 3/2015 | Chen | .................... | H05K 7/1489 211/192 |

(Continued)

*Primary Examiner* — Stanton L Krycinski
(74) *Attorney, Agent, or Firm* — Polsinelli PC

(57) ABSTRACT

A chassis rail stabilizer that may be used to securely support a rack mount rail in a server rack, in particular during transportation of the server rack. The chassis rail stabilizer includes a first body with a front face and a back face, and four rail supporting sides. The stabilizer further includes a second body extending off of the front face of the first body and an offset threaded through hole that extends through the first and second bodies. The offset nature of the through hole is such that the stabilizer may be secured to a vertical mounting post in a server rack in one of four orientations. Each orientation causes one of the rail supporting sides to extend downward a different distance to support a top surface of the rail beneath.

16 Claims, 12 Drawing Sheets

(56) References Cited

U.S. PATENT DOCUMENTS

| | | | | |
|---|---|---|---|---|
| 9,107,322 B2* | 8/2015 | Chuang | ................ | H05K 7/1489 |
| 9,125,489 B2* | 9/2015 | Chen | .................... | A47B 88/044 |
| 2003/0034717 A1* | 2/2003 | Yao | ......................... | G06F 1/183 |
| | | | | 312/223.1 |
| 2010/0200523 A1* | 8/2010 | Henderson | ........... | A47B 88/044 |
| | | | | 211/26 |
| 2012/0074281 A1* | 3/2012 | Chen | .................... | H05K 7/1421 |
| | | | | 248/224.8 |

* cited by examiner

Front Isometric View

Interior Side View

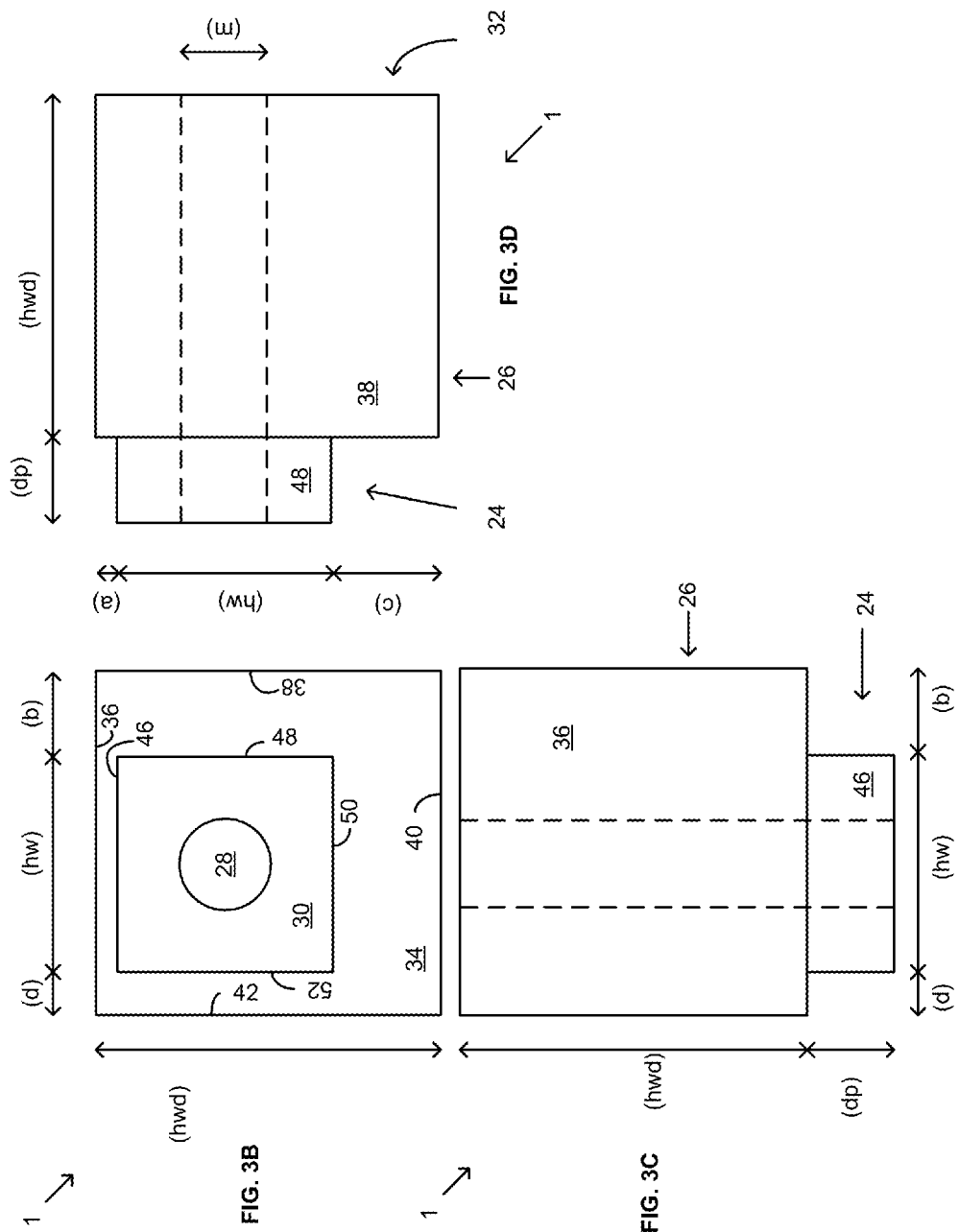

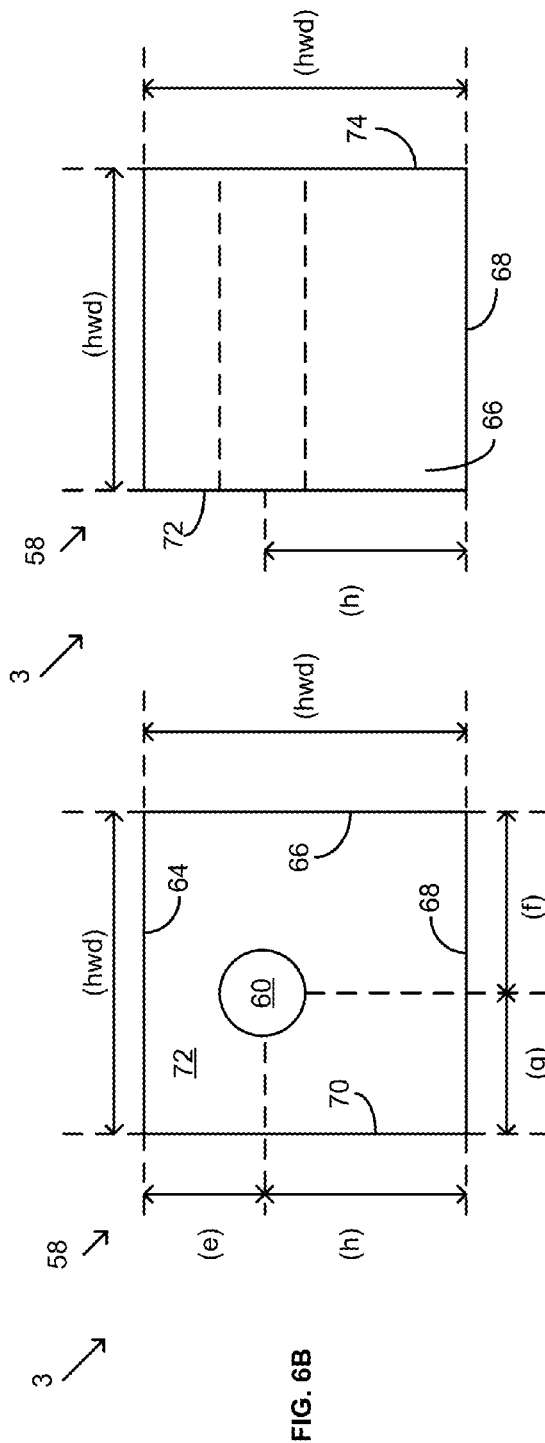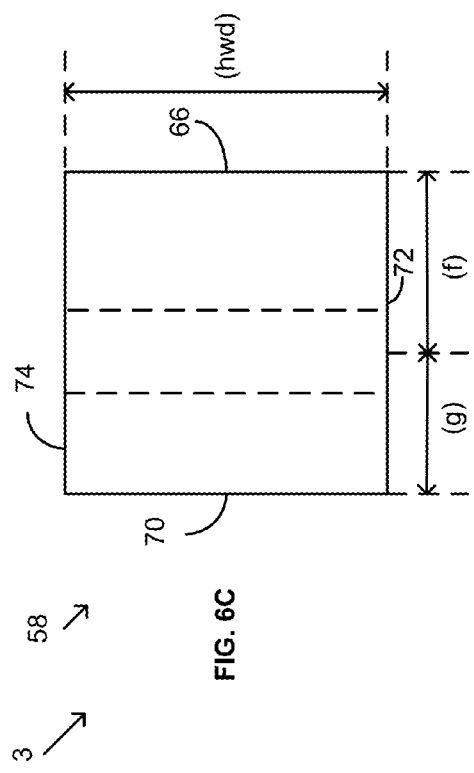
FIG. 6B
FIG. 6C
FIG. 6D

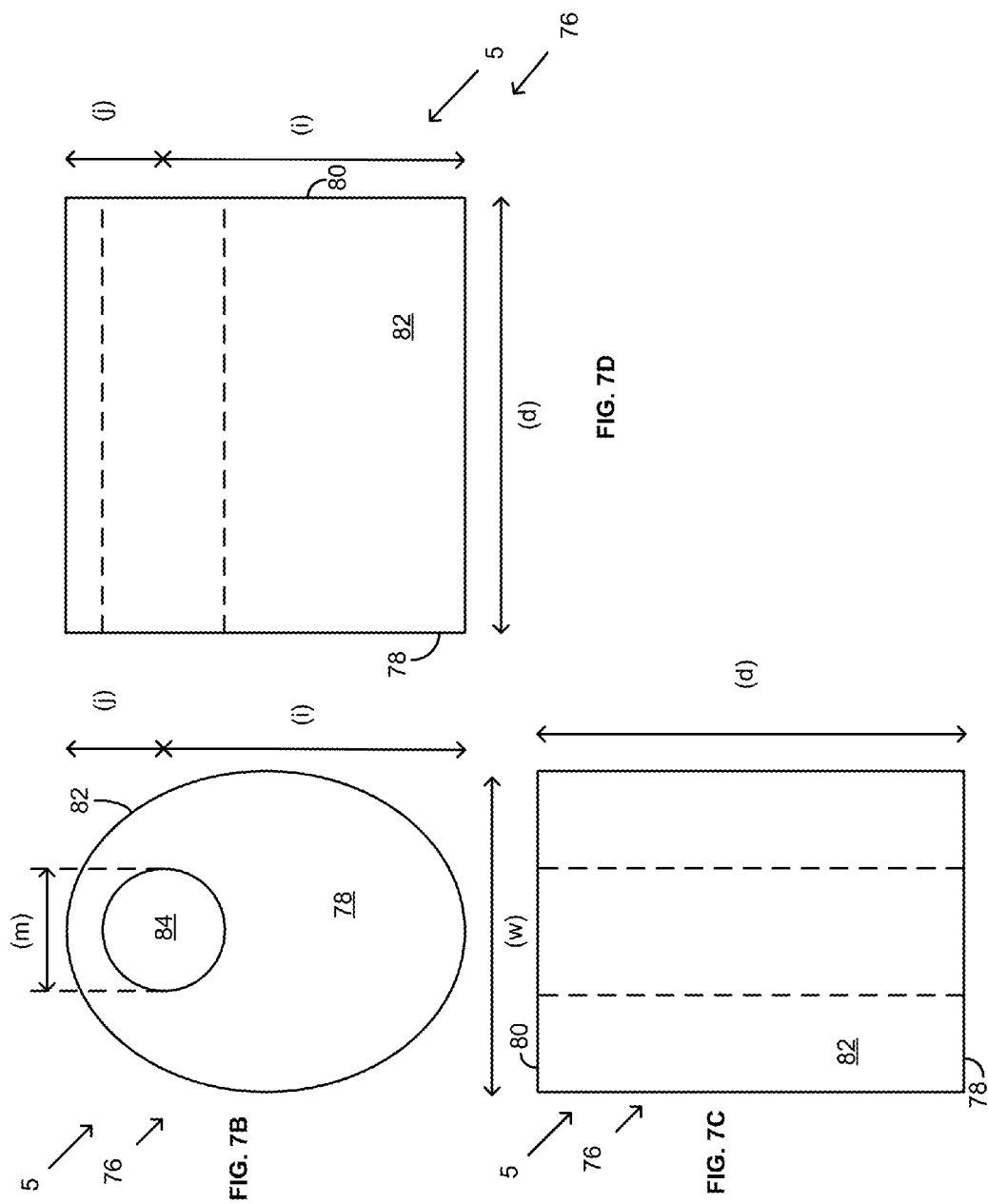

CHASSIS RAIL STABILIZER

TECHNICAL FIELD

Aspects of the present disclosure involve a rack mount rail stabilizer and more particularly involve a device that may be used to securely support and stabilize a wide variety of server rails that are installed in a computer or server rack.

BACKGROUND

A data center is a facility for housing numerous types of computing, storage, and telecommunications equipment. Building a data center may entail collecting, configuring, and integrating a labyrinth of computers, servers, storage, and telecommunication equipment, among other pieces of equipment, and the devices needed to power, cool, and otherwise support the data center. To minimize installation time, among other reasons, systems are often shipped with the data center equipment installed within a rack and supported on rails within the rack. While certain pieces of equipment may be shipped separately from the system itself (i.e., not in the computer rack), often the corresponding rails remain installed in the computer rack during shipment of the system. Both the rails that support a piece of equipment during shipping and the rails that do not support a piece of equipment during shipping pose a problem in that the rails may jostle and dislodge due to the vibrations experienced during the shipping and receiving process. The jostling and dislodging of the rails can cause the rails to bend or, worse, can cause the pieces of equipment on the dislodged rails to fall within the rack and damage the system.

SUMMARY

Aspects of the present disclosure involve a chassis rail stabilizer that may be used to securely support a rack mount rail in a computer rack, in particular during transportation of the rack. In one embodiment, the stabilizer includes a first body with a front face, a back face, and four rail supporting sides. The stabilizer additionally includes a second body extending off of the front face of the first body. The second body includes an offset threaded through hole that extends through the first and second bodies. The through hole is offset such that the stabilizer may be secured to a vertical mounting post in the rack in one of four orientations. With each orientation of the stabilizer relative to the vertical mounting post, a different rail supporting side extends downward a different distance to support a top surface of a rail beneath.

Other embodiments may include a system for supporting equipment in a framing structure, wherein the system comprises: a server rack, at least one rack mount rail, and a rail stabilizer. Other embodiments may include a method of supporting a rack mount rail within a server rack. Additionally, other embodiments are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modification in various aspects, all without departing from the spirit and scope of the presently disclosed technology. Accordingly, the drawings and detailed description are to be regarded as illustrative in nature and not limiting.

BRIEF DESCRIPTION OF THE DRAWINGS

Example embodiments are illustrated in referenced figures of the drawings. It is intended that the embodiments and figures disclosed herein are to be considered illustrative rather than limiting. Also, in the drawings the like reference characters refer to the same parts throughout the different views.

FIG. 3B is a front view of the first embodiment of the chassis rail stabilizer;

FIG. 3C is a top view of the first embodiment of the chassis rail stabilizer;

FIG. 3D is a right side view of the first embodiment of the chassis rail stabilizer;

FIG. 6B is a front view of the second embodiment of the chassis rail stabilizer;

FIG. 6C is a top view of the second embodiment of the chassis rail stabilizer;

FIG. 6D is a right side view of the second embodiment of the chassis rail stabilizer;

FIG. 7B is a front view of the third embodiment of the chassis rail stabilizer;

FIG. 7C is a top view of the third embodiment of the chassis rail stabilizer; and FIG. 7D is a right side view of the third embodiment of the chassis rail stabilizer.

DETAILED DESCRIPTION

Aspects of the present disclosure involve a chassis rail stabilizer that may securely support computer rails or slides ("rails") that are mounted to opposing vertical mounting posts positioned fore and aft within a computer or server rack ("server rack" or "rack"). The chassis rail stabilizer is additionally adapted to securely support computer rails having a wide variety of geometries. The chassis rail stabilizer is secured to the vertical mounting posts via one of a variety of through holes provided in the vertical mounting post. To stabilize a computer rail, the rail stabilizer is positioned in a particular through hole located directly above a top surface of the computer rail on an internal surface of the vertical mounting post. Generally speaking, the stabilizer has a non-symmetrical, multi-face head or nut that may be oriented in a variety of positions to provide different engaging geometries to secure different rail geometries. Thus, depending on the unique geometry of the computer rail (e.g., a distance that a top surface of the computer rail gaps to a nearest unobstructed through hole above the rail), the rail stabilizer may be placed in one of a number of orientations within or relative to the through hole of the vertical mounting post such that the rail stabilizer will securely support the top surface of the computer rail beneath.

Figure 1:
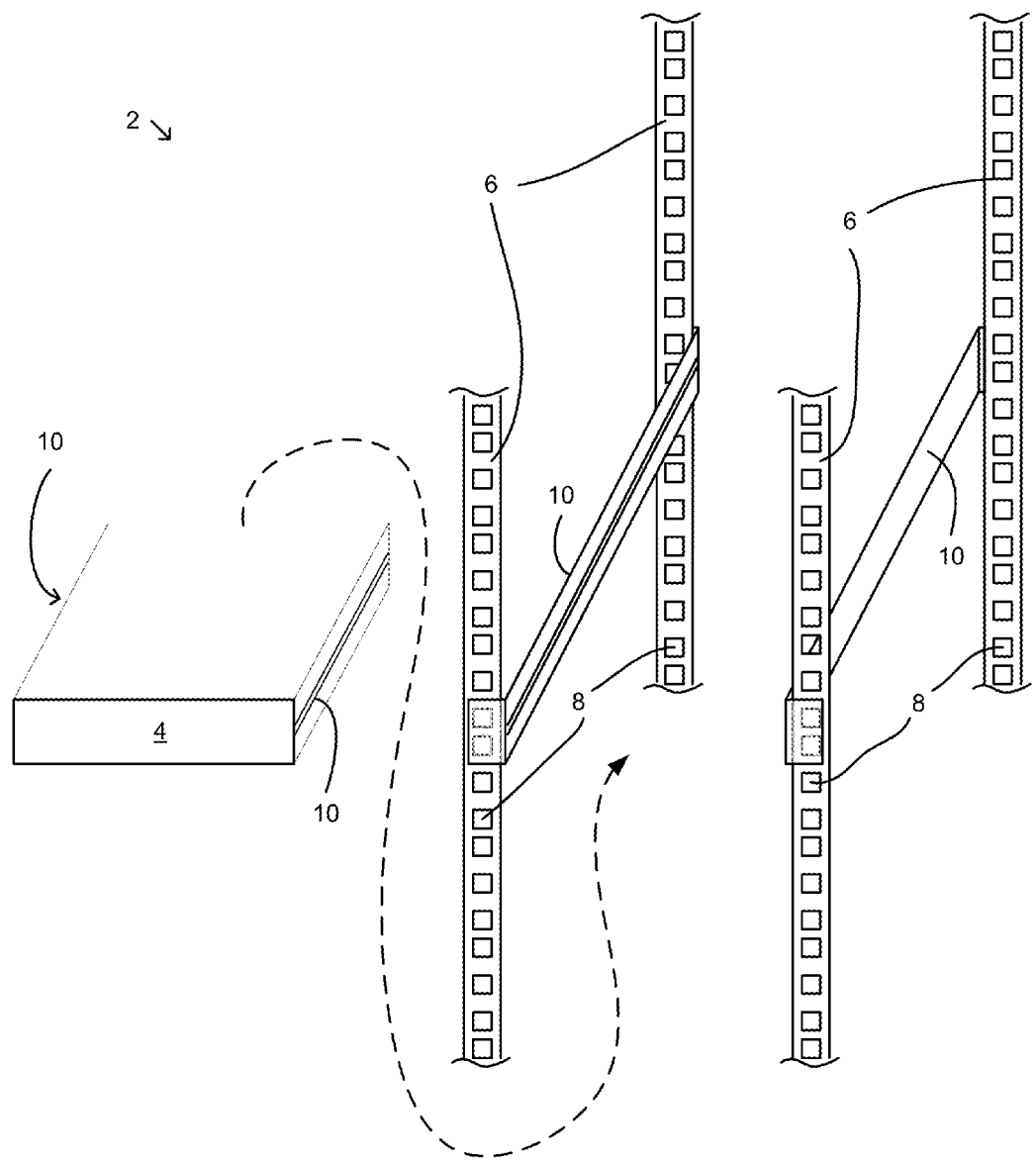
FIG. 1 is a front isometric view of a server rack with installed computer rails and a rack mount chassis to be installed in the rack.

To begin, a discussion of server racks and rails is in order. Referring to FIG. 1, a server rack 2 includes a frame or enclosure for supporting one or more rack mount chassis 4 (e.g., server, switch, storage library, monitor, power supply) housed within the rack 2. A standard width of the server rack 2 is typically 19 inches or 23 inches; a standard height of the server rack 2 is typically 42 rack units or 42 U (e.g., 1 U=1.75 inches). There are, however, alternative heights and widths. The width of each chassis 4 corresponds with the width of the respective server rack (e.g., 19 inch, 23 inch). Similarly, each chassis 4 is of a height that is also measured in rack units. Thus, for example, a rack may potentially include up to forty-two chassis 4, if each chassis 4 is 1 U in height. The frame of the server rack 2 may additionally include panels or doors on one or all sides of the server rack 2 to fully or partially enclose the rack 2.

Continuing with the structure of the rack 2, the frame includes vertical mounting posts 6 in at least four corners of the server rack 2. The vertical mounting posts 6 include through holes 8 that extend, fore to aft, through the mounting posts 6. The through holes 8, which may be round or square, are vertically positioned on the mounting posts 6 in fractions or multiples of 1 U increments (e.g., 0.625 apart, 1.75 inches apart). The vertical mounting posts 6 support a weight of the various rack mount chassis 4 that are housed within the server rack 2.

Figure 2A:
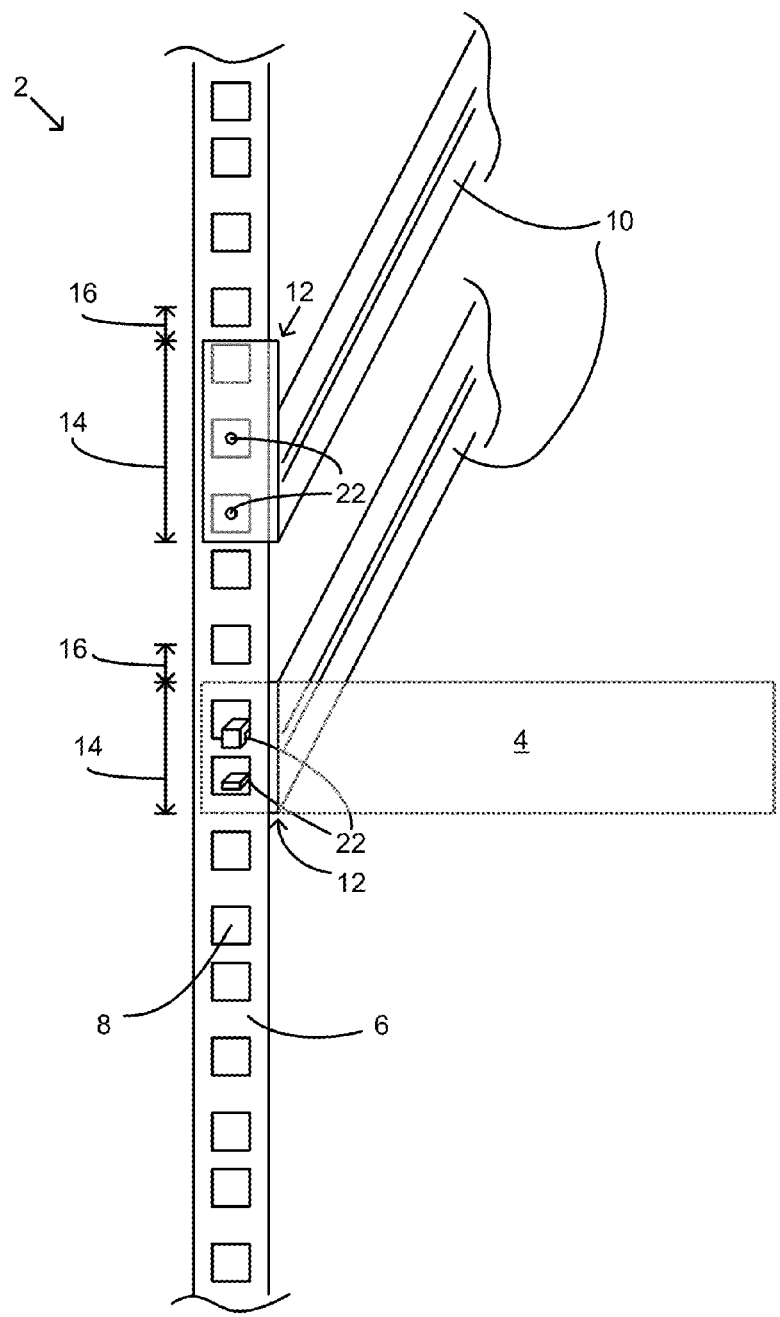
FIG. 2A is front isometric view of a vertical mounting post with installed computer rails and a front of a chassis shown in broken line.
Figure 2B:
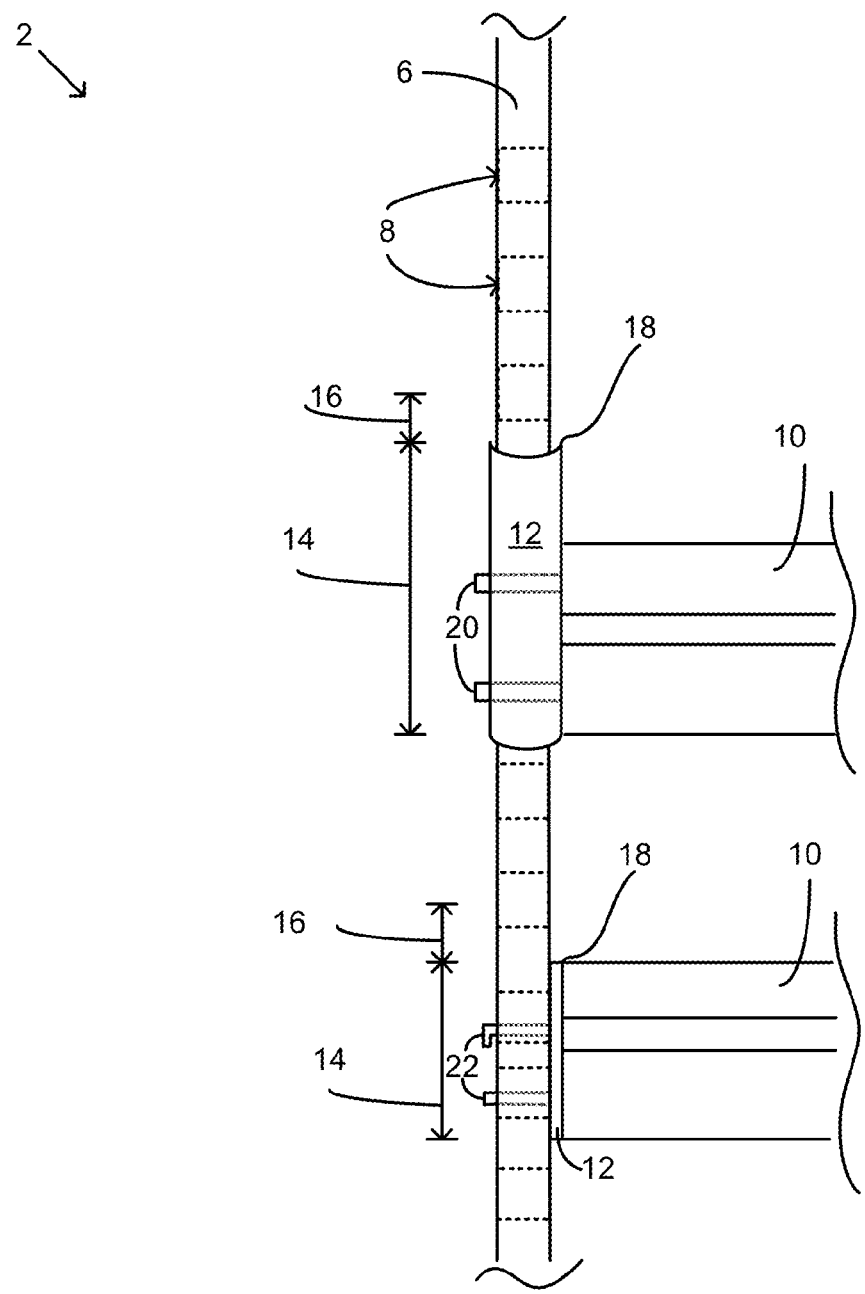
FIG. 2B is an interior side view of the vertical mounting post with installed computer rails of FIG. 2A.
Figure 3A:
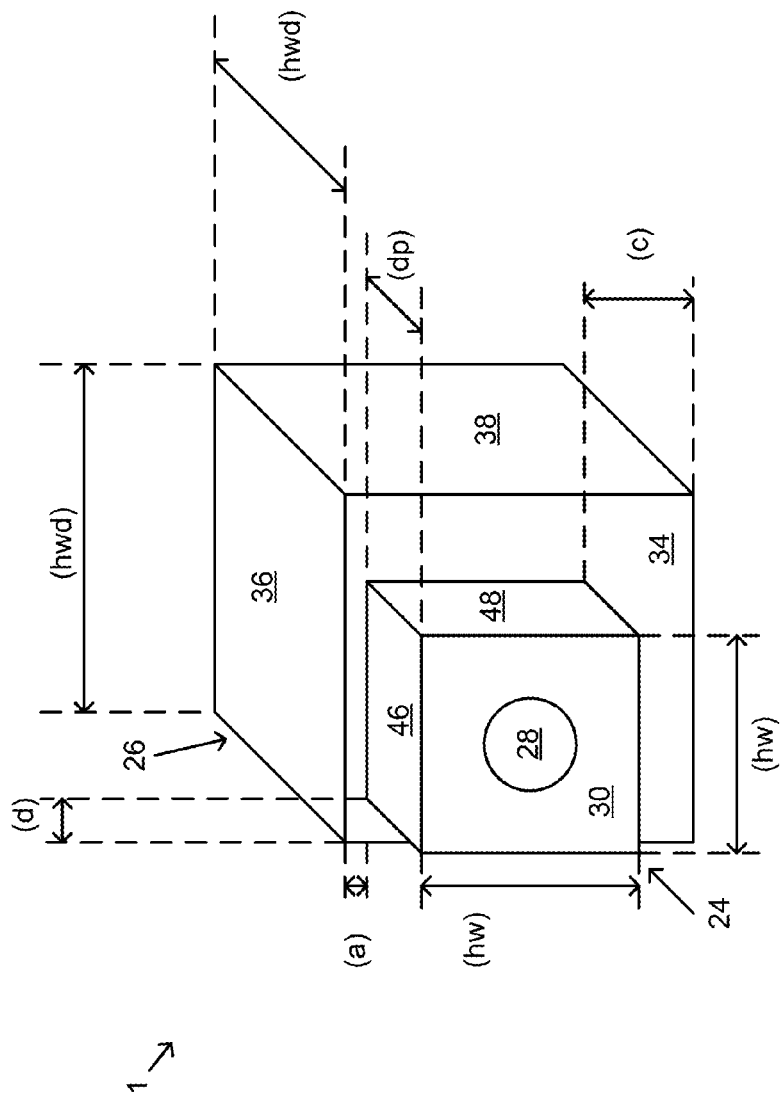
FIG. 3A is a front isometric view of a first embodiment of a chassis rail stabilizer.

Often, the posts 6 support a pair of rails 10. The rails extend between respective fore and aft posts 6 to support both sides of a chassis 4. Stated differently, the rack mount chassis 4 is supported within the server rack 2 via rails 10 that affix to opposing sides of the chassis 4. The rails 10 enable a data center worker to easily access the chassis 4 by sliding the chassis 4 in and out of the rack 2 for maintenance or otherwise. Referring to FIGS. 2A and 2B, the rails 10 include mounting hardware 12 at a front end and a back end of the rails 10. The mounting hardware 12 is configured to engage the vertical mounting posts 6, which are positioned on each respective corner of the rack 2, and to transmit the weight of the rack mount chassis 4 to the posts 6. Thus, a single rack mount chassis 4 is generally supported by a rail 10 on a first side of the chassis 4 that engages a front and a back vertical mounting post 6 on a first side of the rack 2. Similarly, a second side of the chassis 4 is supported by a rail 10 that engages a front and a back vertical mounting post 6 on a second side of the rack 2.

Turning now to the relationship and engagement of the rails 10 with the vertical mounting posts 6, reference is made to FIGS. 2A-2B. As seen in the figures, the size of the mounting hardware 12 may vary for each rail 10. For instance, the mounting hardware 12 may have varying heights 14 and, thus, span a varying number of through holes 8 on its respective vertical mounting post 6. Because of the varying heights 14 of the mounting hardware 12, a top surface 18 of the mounting hardware 12 may be spaced varying distances 16 to a nearest unobstructed through hole 8 above the top surface 18 of the hardware 12 (the "gap" 16).

In addition to the size, the configuration of the mounting hardware 12 may vary for each rail 10 installed within the rack 2. For instance, as shown in FIGS. 2A-2B and referring to the rail 10 at an upper end of the post 6, the hardware 12 wraps around an interior side of the mounting post 6 and is secured on the post 6 via a pair of pins 20 that extend through the hardware 12 and the through holes 8. Now referring to the rail 10 at a lower end of the post 6, the mounting hardware 12 engages with the post 6 on an interior side of the post 6 and does not wrap around the post 6. The hardware 12 has of a pair of tabs 22 that extend through the through holes 8 to support a downward force associated with the weight of the rails 10 and the chassis 4. For this particular type of mounting hardware 12, one of the tabs 22 is angled downward such that to remove the rail 10, a user must lift the rail 10 to disengage the angled tab 22 with the through hole 8. There are other types of hardware that may take advantage of various aspects of the present disclosure.

While the size and configuration of the rails 10 may vary, a common feature of a majority of rails 10 is that the rails 10, or more particularly the mounting hardware 12 on the rails, are susceptible to dislodging when the rack 2 is subjected to vibrations and jostling associated with shipping. The rails are susceptible to the vibrations because the mounting hardware 12 is typically designed to support a static load from a chassis 4; the mounting hardware 12 is typically not designed to support a dynamic load of a chassis 4 associated with vibrations experienced during transportation of a server rack 2 with installed rails 10 and/or installed chassis 4 on the rails 10. As seen in FIGS. 2A-2B, the rail 10 at the lower end of the post 6 is clearly not designed to prevent upward movement of the rail 10. Rather, the hardware 12 is designed to disengage with the vertical mounting post 6 by application of an upward force.

It is with these thoughts in mind that show a need for a device to securely support a rail 10 that is installed in a server rack 2, in particular for when the rack 2 experiences periods of dynamic loading or vibrations. It is noted that while a rail stabilizer is discussed in the context of server racks 2, rails 10, and vertical mounting posts 6, the rail stabilizer is applicable to support any number of structures on any type of frame assembly. The present disclosure is not meant to be limited to supporting rails 10 on a server rack 2 as there are many other applications for using the rail stabilizer.

Turning now to the rail stabilizer and referring to FIGS. 3A-3D, a first embodiment of the rail stabilizer 1 is a customized nut that engages with the through hole 8 on an interior side of the post 6, above the mounting hardware 12 of the rail 10 beneath. In one of four unique positions or orientations of the stabilizer 1 relative to the through hole 8, the stabilizer 1 will securely support the top surface 18 of the mounting hardware 12 and, thus, limit vertical displacement of the rails 10 within the server rack 2.

In the first embodiment, the rail stabilizer 1 comprises a first, block-like body 24 and a second, block-like body 26. The first body 24 includes four sides 46, 48, 50, 52 and a front face 30, whereas the second body 26 includes four rail supporting surfaces 36, 38, 40, 42, a front face 34, and a back face 32. The first body 24 extends from the front face 34 of the second body 26 and may be unitarily constructed with the second body 26 (e.g., cast, machined, printed). Conversely, the first and the second bodies 24, 26 may include a union of a back face of the first body 24 and a front face 34 of the second body 26 (e.g., glue, weld, braze).

The stabilizer 1 includes an engaging feature that is configured to assist in engaging the stabilizer 1 to the vertical mounting post 6 of the rack 2. The engaging feature may include a through hole 28 (e.g., threaded, unthreaded) that extends from and through the front face 30 of the first body 24 to the rear face 32 of the second body 26. Alternatively, the engaging feature may include a member, such as a post (e.g., threaded, unthreaded) that extends from the front face of the first body. While most of the description will focus on the through hole 28 as the engaging feature, the description is also applicable to a design with a member as the engaging feature. Referring now to the through hole 28, the through hole 28 may be centered relative to the first body 24. The through hole 28 may, however, not be centered on the front or the back face 34, 32 of the second body 26. Rather, the first body 24 and, thus, the through hole 28 may be uniquely offset from a center point of the front face 34 of the second body 26. The offset nature of the first body 24 relative to the second body 26 is such that each of the rail supporting surfaces 36, 38, 40, 42 spans a unique distance from the through hole 28 to a respective edge of the supporting surfaces 36, 38, 40, 42. Similarly, each of the rail supporting surfaces 36, 38, 40, 42 also spans a unique perpendicular distance (a), (b), (c), (d) from the corresponding sides 46, 48, 50, 52 of the first body 24 to the rail supporting surfaces 36, 38, 40, 42.

The unique distances (a), (b), (c), (d) that the sides 46, 48, 50, 52 extend to each of the supporting surfaces 36, 38, 40, 42 enables the stabilizer 1, or more particularly the first body 24, to be positioned within the square through hole 8 on the vertical mounting post 6 in one of four positions such that one of the unique distances (a), (b), (c), (d) extends downwards, toward the top surface 18 of a rail 10 beneath. The four positions of the first body 24 relative to the through hole 8 enables the stabilizer 1 to securely support various rail 10 geometries with varying gaps 16 with a single device.

Figure 4:
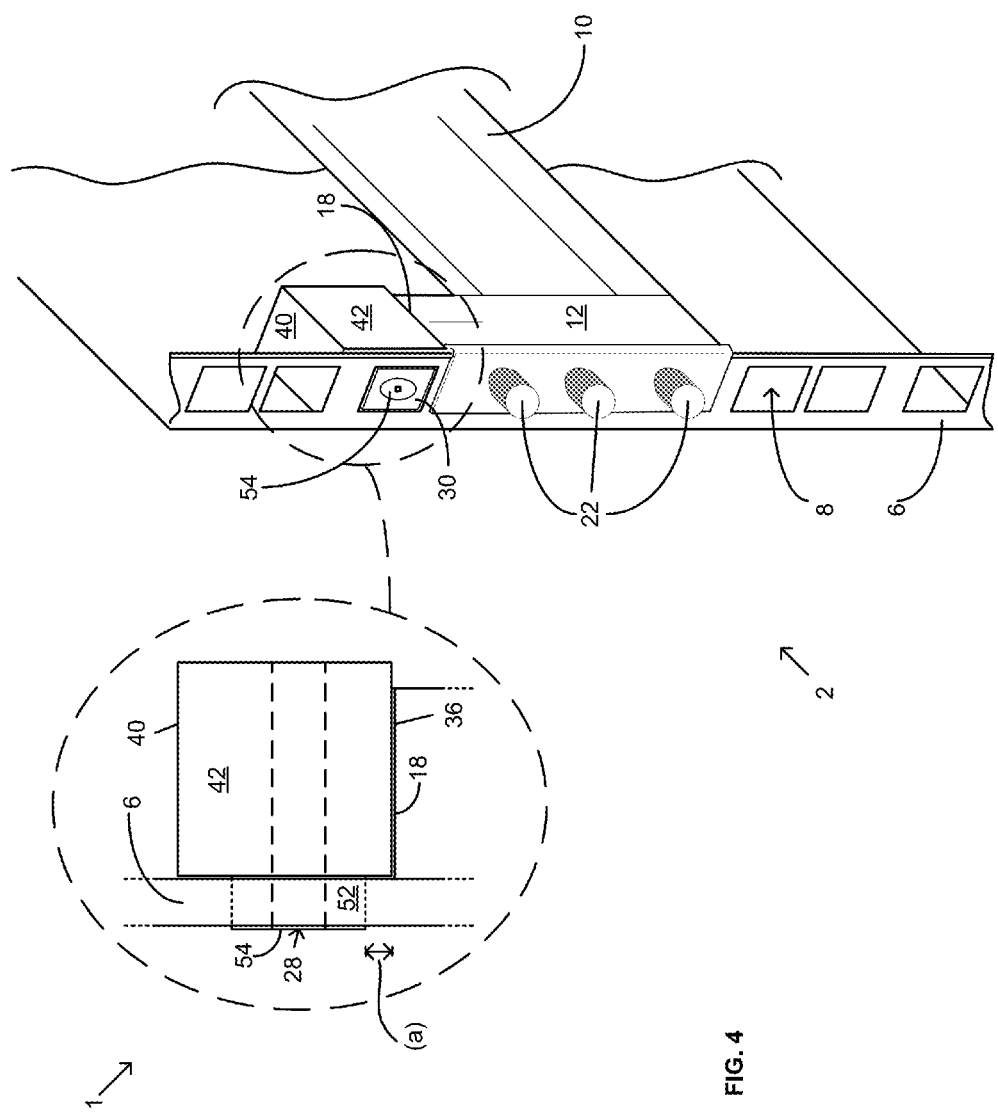
FIG. 4 is a perspective view and a close-up side view of the first embodiment of the chassis rail stabilizer supporting a computer rail in a server rack.
Figure 5B:
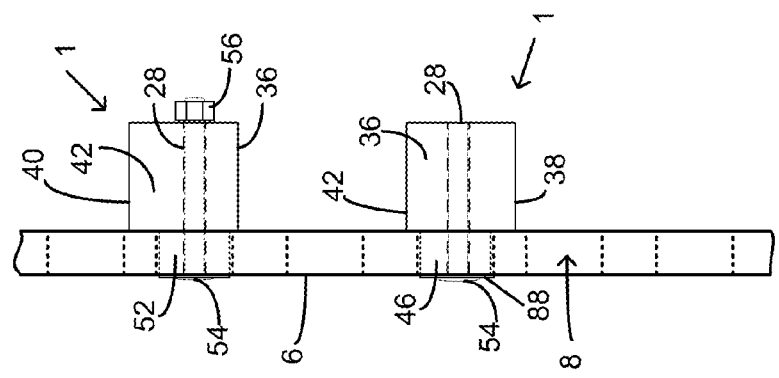
FIG. 5B is a side view of the two chassis rail stabilizers of FIG. 5A.
Figure 5A:
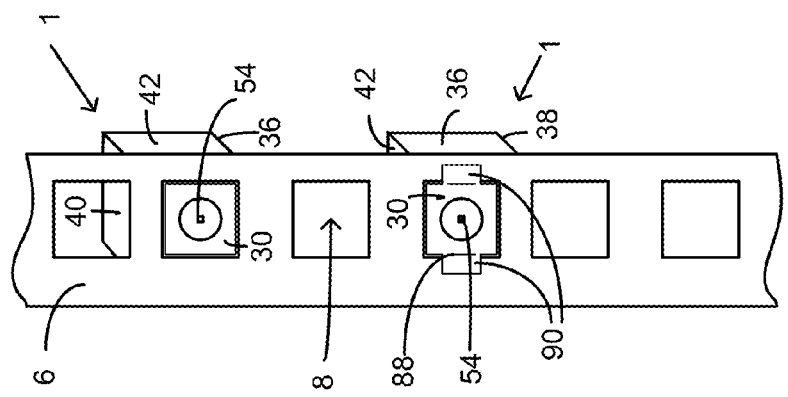
FIG. 5A is a front isometric view of two chassis rail stabilizers of the first embodiment that are installed in a vertical mounting post of a server rack.
Figure 6A:
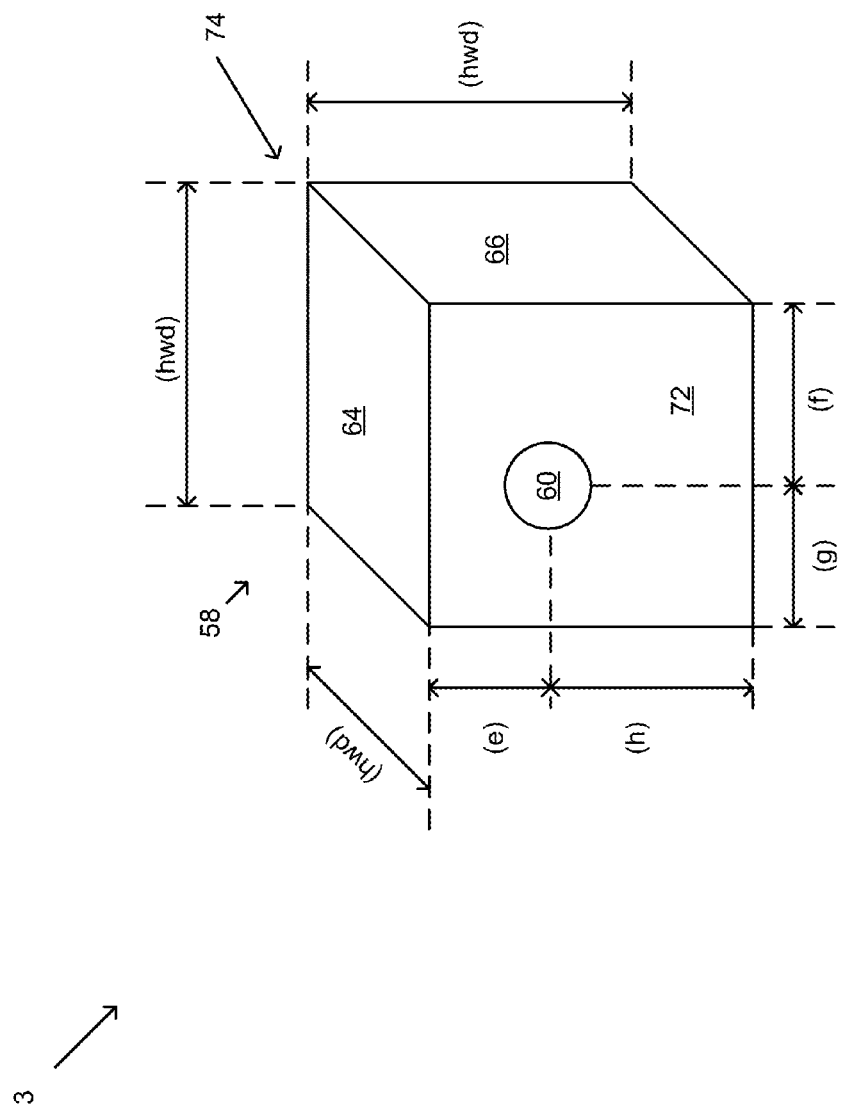
FIG. 6A is a front isometric view of a second embodiment of a chassis rail stabilizer.
Figure 7A:
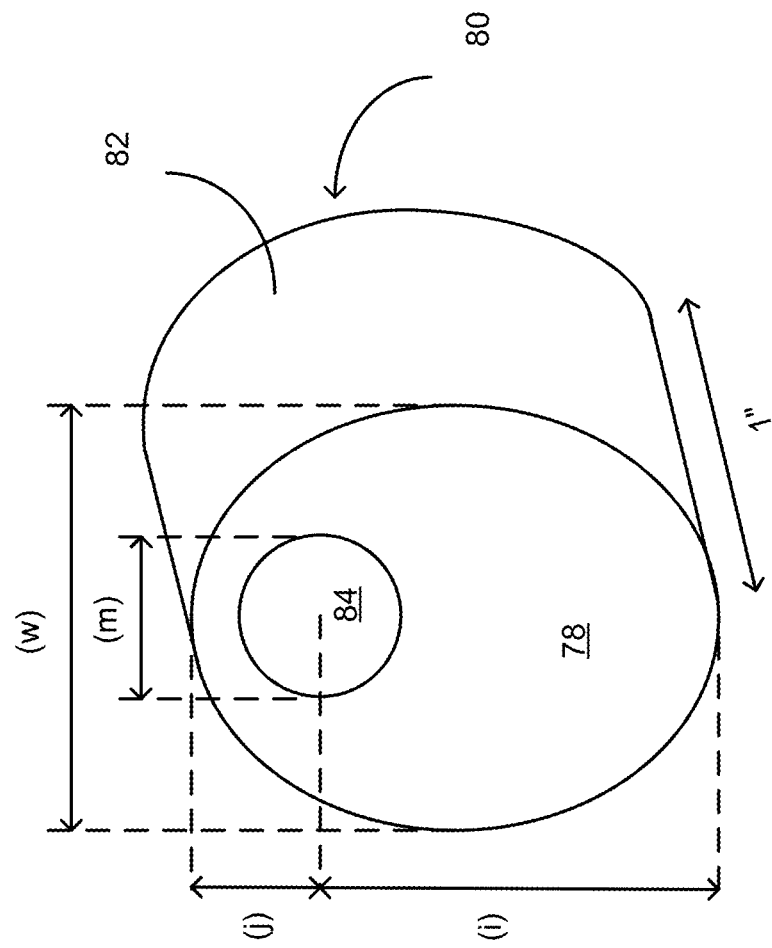
FIG. 7A is a front isometric view of a third embodiment of a chassis rail stabilizer.

To further illustrate the four positions of the stabilizer 1, reference is drawn again to FIGS. 3A-3D as well as FIGS. 4 and 5A-5B. In a first position, as illustrated in FIG. 4, the first body 24 may be positioned within a through hole 8 of a vertical mounting rail 6 such that the rails supporting surface 36 extends downward a first distance (a). In a second position, as illustrated in FIGS. 5A-5B, the first body 24 is rotated counterclockwise, 90 degrees, from the first position such that the rail supporting surface 38 extends downward a second distance (b). Similarly, in a third position, the first body 24 is rotated counterclockwise, 90 degrees, from the second position such that the rail supporting surface 40 extends downwards a third distance (c). Finally, in a fourth position, the first body 24 is rotated counterclockwise, 90 degrees, from the third position such that the rail supporting surface 42 extends downward a fourth distance (d). Thus, the stabilizer 1 may be positioned in one of the four positions such that it will support the top surface 18 of mounting hardware 12 that gaps a corresponding unique distance 16 from the nearest unobstructed through hole 8. Stated differently, since a top surface 18 of different types of rails 10 often gap a unique distances upwards 16 towards a nearest unobstructed through hole 8, the stabilizer 1 may be used in one of four orientations or positions such that a rail supporting surface 36, 38, 40, 42 extends a similar distance (a), (b), (c), (d) downward that corresponds to the unique distance 16 of the top surface 18 of the rail 10.

With reference to FIGS. 4 and 5A-5B, when a rail 10 is installed and one of the four positions of the rail stabilizer 1 is chosen such that the rail 10 is securely supported, a threaded member 54 is threadably engaged with the through hole 28 of the stabilizer 1 (i.e., assuming that the through hole 28 is threaded). Thus, the threaded member 54 secures the rail stabilizer 1 and the rail 10 in the appropriate position. Alternatively, if the through hole 28 on the stabilizer 1 is unthreaded, the threaded member 54 may be positioned through the through hole 28 of the stabilizer 1 and threadably engaged with a nut 56 that tightens against the back face 32 of the second body 26. Other mechanisms to secure the stabilizer 1 to the vertical mounting post 6 are possible. For example, a pin (e.g., clevis, wire lock, hitch, snap) and a corresponding clip, if necessary, may be utilized in place of a threaded member 54 and a nut 56. Such a mechanism may be custom fit to the stabilizer 1, or may be an off-the-shelf fastener.

In one possible implementation, referring to FIG. 3A-3D, the second body 26 of the stabilizer 1 may have a height, width, and depth (hwd) of about 1 inch. The first body 24, on the other hand, may have a height and width (hw) of about ⅝ inch and a depth (dp) of about ¼ inch. The height and width (hw) of the first body 24 corresponds with a height and width of a standard size, square through hole 8 on a typical vertical mounting posts 6. The through hole 28 may have a diameter (m) of about 6 mm and, if threaded, utilize an M6 thread.

Turning now to the offset nature of the first body 24 relative to the second body 26, a first perpendicular distance (a) between support surface 36 of the second body 26 and the corresponding side 46 of the first body 24 is about 1/16 inch. A second perpendicular distance (b) between support surface 38 and the corresponding side 48 is about ¼ inch. A third perpendicular distance (c) between support surface 40 and the corresponding side 50 is about 5/16 inch. Finally, a fourth perpendicular distance (d) between support surface 42 and the corresponding side 52 is about ⅛ inch. The dimensions listed above are exemplary and depend on various factors, many of which relate to dimensions associated with the server rack 2, the vertical mounting posts 6, the through holes 8, and the rails 10, among others. In addition, while the first embodiment of the rail stabilizer 1 includes four rail supporting surfaces 36, 38, 40, 42, the stabilizer 1 may include more or less supporting surfaces (e.g., 3, 5, 6, 8) and accomplish a similar function of supporting a rail 10 in a server rack 2.

Referring now to FIGS. 6A-6D, a second embodiment of the rail stabilizer 3 includes a single body 58 that includes four rail supporting surfaces 64, 66, 68, 70, a front and a back face 72, 74 and a through hole 60 (e.g., threaded, unthreaded) extending through the body 58. Similar to the first embodiment, the through hole 60 of the rail stabilizer 3 is asymmetrically offset from a center point of the front and back face 72, 74 such that each of the rail supporting surfaces 64, 66, 68, 70 extends a unique distance (e), (f), (g), (h) from a center point of the through hole 60 to an outer edge of the rail supporting surface 64, 66, 68, 70.

Referring now to each of the unique distances (e), (f), (g), (h), rail supporting surface 64 is spaced a first distance (e) from the through hole 60 of the stabilizer 3. Rail supporting surface 66 is spaced a second distance (f) from the through hole 60 of the stabilizer 3. Rail supporting surface 68 is spaced a third distance (g) from the through hole 60 of the stabilizer. Finally, rail supporting surface 70 is spaced a fourth distance (h) from the through hole 60 of the stabilizer.

Thus, the stabilizer 3 may be positioned in one of the four positions such that one of the supporting surfaces 64, 66, 68, 70 will support a top surface 18 of mounting hardware 12 that gaps a corresponding unique distance 16 from the nearest unobstructed through hole 8. Stated differently, since a top surface 18 of different types of rails 10 may be spaced or gap 16 a unique distances upwards towards a nearest unobstructed through hole 8 (e.g., round, square), the stabilizer 1 may be used in one of four orientations or positions such that a rail supporting surface 64, 66, 68, 70 extends a similar distance (e), (f), (g), (h) downward that corresponds to the unique distance 16 of the top surface 18 of the rail 10. The four positions of the body 58 relative to the through hole 8 enables the stabilizer 3 to securely support various rail 10 geometries with a single device.

Turning to some similarities between the first and the second embodiments, the second embodiment of the stabilizer 3 is similar to the second body 26 of the first embodiment of the rail stabilizer 1. In particular, the second embodiment is like the first embodiment, simply without the first body 24, which fits within a square through hole 8 of a vertical mounting post 6. The second embodiment of the rail stabilizer 3 includes only a single body 58 that is positioned on an internal side of the vertical mounting post 6, but the body 58 does not, however, fit within the through hole 8 of the mounting post 6. Thus, the rail stabilizer 3 is not restricted into one of four configurations by its orientation within the through hole 8. As such, a threaded member 62 secures the stabilizer 3 to the mounting post 6, as in the first embodiment, but the stabilizer 3 may be rotated into a suitable supporting position when supported by the mounting post 6 since the stabilizer 3 is not restricted by a first body that fits within the through hole 8.

While the second embodiment of the rail stabilizer 3 is compatible with vertical mounting posts 6 having square holes 8, this embodiment of the rail stabilizer is also useful with computer racks having round through holes 8 in the vertical mounting posts 6. In this embodiment, the rail stabilizer 3 may be positioned such that it securely supports the rails 10 in place, and then the threaded member 62 may be threadably received through the vertical mounting post 6 and by the threaded through hole 60 of the rail stabilizer 3 or a nut on a back side of the stabilizer 3. Additionally and as discussed previously, other mechanism may be utilized to secure the stabilizer 3 to the vertical mounting post 6.

As a non-limiting example of dimensions of stabilizer 3 and referring to FIG. 6A-6D, the body 58 of the stabilizer 3 may have a height, width, and depth (hwd) of about 1 inch. The through hole 60 may have a diameter (m) of about 6 mm and, if threaded, utilize an M6 thread.

Turning now to the asymmetric, offset nature of the through hole 60 relative to a center point of the body 58, a first perpendicular distance (e) between support surface 64 and the through hole 60 is about ⅜ inch. A second perpendicular distance (f) between support surface 66 and the through hole 60 is about 9/16 inch. A third perpendicular distance (g) between support surface 68 and the through hole 60 is about 7/16 inch. Finally, a fourth perpendicular distance (h) between support surface 70 and the through hole 60 is about ⅝ inch. The dimensions listed above are exemplary and depend on various factors, many of which relate to standard dimensions associated with the server rack 2, the vertical mounting posts 6, the through holes 8, and the rails 10, among others. In addition, while the second embodiment of the rail stabilizer 3 includes four rail supporting surface 64, 66, 68, 70 the stabilizer 3 may include more or less supporting surfaces (e.g., 3, 5, 6, 8) and accomplish a similar function of supporting a rail 10 in a server rack 2.

Referring to FIGS. 7A-7D, in a third embodiment, the rail stabilizer 5 includes a single cam shaped body 76 that includes a front and a back planar face 78, 80, a continuous rail supporting surface 82 between the planar faces 78, 80 and a through hole 84 (e.g., threaded, unthreaded) extending between the front and back planar faces 78, 80. As shown in FIGS. 7A-7D, the through hole 84 may be asymmetrically offset from a center point on the planar faces 78, 80. However, the through hole 84 may be centered in the planar faces 78, 80 in certain embodiments. While the body 76 in FIGS. 7A-7D is elliptical, the cam shaped body 76 may also be round, egg-shaped, eccentric, snail, etc. The cam shaped body 76 may include any shape such that as the stabilizer 5 rotates about the through hole 84, the cam body 76 acts as a cam. Generally speaking, a purpose of the cam shaped body 76 is to provide a continuous rail supporting surface 82 that provides a range of distances between various points on the continuous surface 82 and the through hole 84. Thus, the continuous rail supporting surface 82 may accommodate a wide variety of spacings or gaps 16 between the supporting surface 82 and the top surface 18 of a computer rail 10 beneath.

Similar to the other embodiments, the rail stabilizer 5 is positioned on an internal side of the vertical mounting post 6. The rail stabilizer 5 is secured to the vertical mounting post via a threaded member 86 that threadably engages with either the through hole 84 (i.e., if the hole 84 is threaded) or a threaded nut on the back face 80 of the stabilizer 5. Additionally and as discussed previously, other mechanisms to secure the stabilizer 5 to the mounting post 6 are possible.

Since the rail stabilizer 5 does not include a square body that engages a square through hole 8 on the vertical mounting post 6, the rail stabilizer 5 may be freely rotated about the threaded member 86 until a portion of the continuous rail supporting surface 82 contacts and supports the computer rail 10 beneath the stabilizer 5. Once a portion of the continuous rail supporting surface 82 contacts and supports the rail 10, the threaded member 86 may be tightened relative to the vertical mounting post 6 until the supporting surface 82 of the cam body 76 securely supports the rail 10 beneath.

Still referring to FIGS. 7A-7D, since the rail stabilizer 5 includes a continuous rail supporting surface 82, the stabilizer 5 encompasses a wide variety of possible positions and orientations to support a rail 10. Stated differently, the stabilizer 5 may be positioned on a mounting post 6 in any rotatable position such that a point(s) on the continuous rail supporting surface 82 will extend downward a distance to support a top surface 18 of mounting hardware 12 that gaps 16 a corresponding distance upward to a center point of the through hole 84. The variably extending points on the continuous rail supporting surface 82 relative to the through hole 8 enables the stabilizer 5 to securely support various rail 10 geometries with varying gaps 16 with a single device.

Referring still to the FIGS. 7A-7D, a center point of the through hole 84 may extend a maximum distance (i) to an edge of the continuous rail supporting surface 82. Accordingly, the center point of the through hole 84 may extend a minimum distance (j) to an edge of the continuous rail supporting surface 82. A width of the stabilizer 5 may be (w) and a depth of the stabilizer 5 may be (d). The through hole 84 may have a diameter (m) of about 6 mm and, if threaded, utilize an M6 thread. As a non-limiting example of dimensions of the rail stabilizer: (i) is about 10/16 inch, (j) is about 5/16 inch, (w) is about 9/16 inch, and (d) is about 1 inch. It is noted that these distances and dimension may vary greatly based on a particular cam shaped body 76 (e.g. egg-shaped, round, eccentric, snail).

In this particular embodiment, the through hole 84 may or may not be centered in the front and back face 78, 80 of the stabilizer 5. As illustrated in FIGS. 7A-7D, the through hole 84 is not centered in the front and back face 78, 80 of the stabilizer 5. However, for example, if the stabilizer 5 is elliptical, the through hole 84 may be centered. In such an orientation, the body 76 will still function as a cam as it rotates.

In any of the embodiments of the device, the rail stabilizer 1, 3, 5 may include a spring cage 88, as shown in FIGS. 5A-5B. The spring cage 88 assists in engaging the stabilizer 1, 3, 5 to the through hole 8 of the vertical mounting post 6. The spring cage 88 may include wing members 90, or similar elements, that wrap around a portion of the stabilizer 1 and "snap" into a square through hole 8 of a vertical mounting post 6. The wing members 90 are adapted to flex when compressed; the flexion allows the wing members 90 of the cage 88 to be placed through the through hole 8. The wing members 90, thus, "snap" back into place by the removal of a compressive force on the wing members 90. The spring cage 88 enables the stabilizer 1, 3, 5 to be positioned relative to the through hole 8 such that the stabilizer 1, 3, 5 may be secured to the vertical mounting post 6 via a threaded or unthreaded member 54, 62, 86 in a relatively hands-free manner.

In any of the embodiments of the device, the rail stabilizer 1, 3, 5 may include a member as the engaging feature, as described above. The member may extend off of the rail stabilizer 1, 3, 5 and engage with a through hole 8 on a vertical mounting post 6. Thus, the member may take the place of a threaded member 54, 62, 86 engaging with a threaded through hole 28, 60, 84 of the stabilizer 1, 3, 5. Stated differently, in an embodiment with a member as the engaging feature, the stabilizer 1, 3, 5 may not include a threaded through hole 28, 60, 84, but instead include a member. The member may be, for example, a threaded post that extends off of the front face 30, 72, 78 of the stabilizer 1, 3, 5. The threaded post may be positioned through a through hole 8 in the vertical mounting post 6 and threadably engaged with a nut on the opposite side of the mounting post 6. The nut may be tightened relative to the threaded post to secure the stabilizer 1, 3, 5 to the mounting post 6. The member may also be an unthreaded post with a snap fitting, spring clip or other mechanism that engages with the unthreaded post.

Turning to the production of the device, the rail stabilizer 1, 3, 5 of any of the previously described embodiments, as well as the threaded member 54, 62, 86, may be machined, cast, forged, pressed, or otherwise formed by methods known in the art. Additionally, the rail stabilizer 1, 3, 5 and the threaded member 54, 62, 86 may be made out of steel, iron, titanium, brass, or aluminum, among others. The specific material may be chosen based on a particular application or environment in which it will be used.

Figure 8:
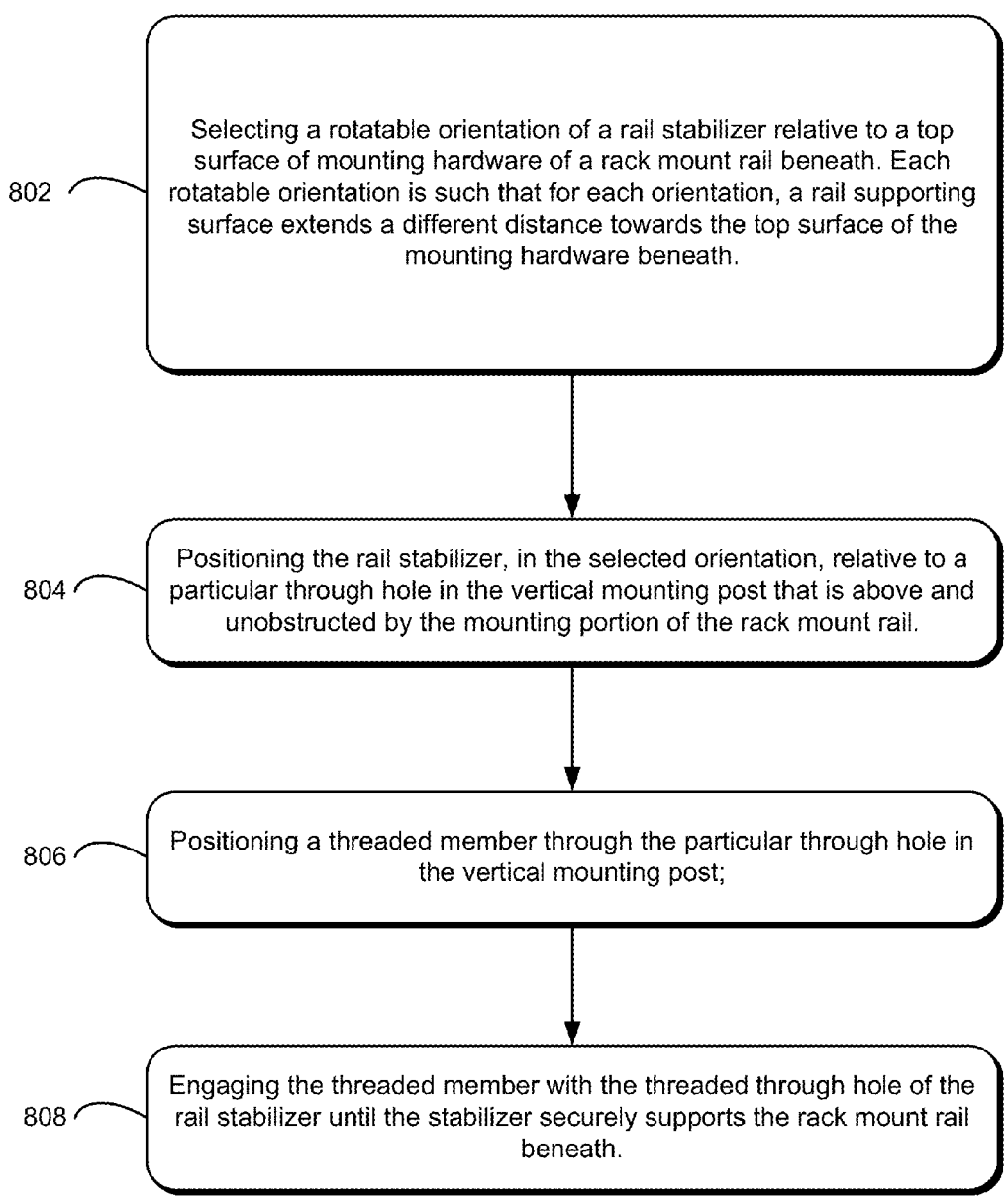
FIG. 8 is a flow chart describing a method of using the chassis rail stabilizer to support a position of a rack mount rail within a server rack.

Reference is now made to a method of using the rail stabilizer 1, 3, 5. Referring to FIG. 8, a method of securing a position of a rack mount rail 10 in a server rack 2 may include selecting an orientation of the rail stabilizer 1, 3, 5 relative to a top surface 18 of mounting hardware 12 of a rail 10 beneath [operation 802]. The rail stabilizer 1, 3, 5 may be positioned in one of various rotatable orientations relative to the top surface 18 of the mounting hardware 12 such that each of the rail supporting surfaces extends a different distance towards the top surface 18 of the mounting hardware 12. The rail stabilizer 1, 3, 5, is then positioned, in the selected orientation, relative to a particular through hole 8 in the vertical mounting post 6 that is above and unobstructed by the mounting hardware 12 of the rail 10 beneath [operation 804]. A threaded member 54, 62, 86 is then positioned through the particular through hole 8 in the vertical mounting post 6 [operation 806]. Finally, the threaded member 54, 62, 86 is engaged with the threaded through hole 28, 60, 84 of the stabilizer 1, 3, 5 until the stabilizer 1, 3, 5 securely supports the positioning of the rack mount rail 10 beneath [operation 808].

Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the described features. As another example, an embodiment may include features that were discussed in reference to other embodiments. Accordingly, the scope of the present disclosure is intended to embrace all such alternatives, modifications, and variations together with all equivalents thereof.

We claim:

1. A stabilizer for supporting a piece of hardware within a frame assembly, the stabilizer comprising:
   a first body comprising a first front face, a first back face that is opposite of and parallel to the first front face, and a first, a second, a third, and a fourth planar supporting side, each of the planar supporting sides extending between the first front face and the first back face, each of the first, second, third, and fourth, planar supporting sides being substantially perpendicular to the first front face and the first back face;
   a second body extending from the first front face, the second body comprising a second front face that is opposite the first back face, and a first, a second, a third, and a fourth planar side, each of the first, second, third, and fourth planar sides extending between the second front face to the first front face, each of the first, second, third, and fourth planar sides being generally perpendicular to the second front face; and
   an engaging feature that is centered in the second front face and offset from a center point of the first back face and the first front face,
   wherein a first, a second, a third, and a fourth perpendicular distance extends from a center point of the engaging feature to the respective first, the second, the third, and the fourth planar supporting sides, wherein the first, the second, the third, and the fourth perpendicular distances are all different from each other,
   wherein the first and second body are configured to be secured to a server rack comprising a frame, the frame comprising at least two vertical mounting posts that extend from a top portion of the frame to a bottom portion of the frame, the at least two vertical mounting posts comprising vertically spaced through holes, the server rack configured to support a rack mount chassis via at least one rack mount rail comprising a rail and mounting hardware at a first end and a second end of the rail, the mounting hardware comprising rail engaging features that engage the vertically spaced through holes to transmit a weight of the at least one rack mount rail to the at least two vertical mounting posts, the first and second body secured to a particular through hole of the vertically spaced through holes that is above and unobstructed by the mounting hardware, the second body supporting a position of the mounting hardware relative to the at least two vertical mounting posts,
   wherein the second body is positioned such that at least one of the first, the second, the third, or the fourth planar supporting sides faces towards a top surface of the mounting hardware, and
   wherein the first and second body are positioned in one of a plurality of rotatable positions such that each of the first, the second, the third, or the fourth planar supporting sides is configured to extend a different distance from the particular through hole towards the top surface of the mounting hardware for each of the plurality of rotatable positions.

2. The stabilizer of claim 1, wherein the engaging feature is a through hole extending from the second front face to the first back face.

3. The stabilizer of claim 1, wherein the engaging feature is a member extending off of the second front face, the member configured to engage with the square through hole on the vertical mounting post.

4. The stabilizer of claim 2, wherein the through hole is a threaded through hole.

5. The stabilizer of claim 1, wherein the first front face defines a height and a width, the height being about one inch, the width being about one inch.

6. The stabilizer of claim 1, wherein the first perpendicular distance is about 3/8 inch, the second perpendicular distance is about 9/16 inch, the third perpendicular distance is about 5/8 inch, and the fourth perpendicular distance is about 7/16 inch.

7. The stabilizer of claim 1, wherein the engaging feature is a through hole that extends from the second front face to the first back face, the through hole being asymmetrically offset from a center point of the first front face and the first back face.

8. The stabilizer of claim 1, wherein the first and second body are aided in engagement with the particular through hole by a spring cage configured first and second body in the one of the plurality of rotatable positions.

9. The stabilizer of claim 1, wherein the engaging feature is a member extending from the second front face of the rail stabilizer.

10. The stabilizer of claim 7, wherein the through hole is a threaded through hole, and wherein a threaded member is configured to threadably engage with the threaded through hole to secure the first and second body to the at least two vertical mounting posts, wherein the first and second body are secured to the at least two vertical mounting posts via the threaded member.

11. A stabilizer for supporting a piece of hardware within a frame assembly, the stabilizer comprising:
a first body comprising a first front face, a first back face that is opposite of and parallel to the first front face, and a first, a second, a third, and a fourth planar supporting side, each of the planar supporting sides extending between the first front face and the first back face, each of the first, second, third, and fourth, planar supporting sides being substantially perpendicular to the first front face and the first back face;
a second body extending from the first front face, the second body comprising a second front face that is opposite the first back face, and a first, a second, a third, and a fourth planar side, each of the first, second, third, and fourth planar sides extending between the second front face to the first front face, each of the first, second, third, and fourth planar sides being generally perpendicular to the second front face; and
an engaging feature that is centered in the second front face and offset from a center point of the first back face and the first front face,
wherein a first, a second, a third, and a fourth perpendicular distance extends from a center point of the engaging feature to the respective first, the second, the third, and the fourth planar supporting sides, wherein the first, the second, the third, and the fourth perpendicular distances are all different from each other,
wherein the second body is positioned relative to a square through hole on a vertical mounting post of a rack, the square through hole being above and unobstructed by a top portion of a rail, and wherein one of the first, the second, the third, or the fourth planar supporting sides supports the top portion of the rail within the rack, and
wherein the second body is positioned relative to the square through hole in one of four orientations such that one of the first, the second, the third, or the fourth planar supporting sides supports the top portion of the rail within the rack, wherein the second body is positionable relative to the square through hole in any of the four orientations so as to extend a different distance from the square through hole towards the top portion of the rail for each of the four orientations.

12. The stabilizer of claim 11, wherein the engaging feature is a through hole extending from the second front face to the first back face.

13. The stabilizer of claim 12, wherein the through hole is a threaded through hole.

14. The stabilizer of claim 11, wherein the engaging feature is a member extending off of the second front face, the member configured to engage with the square through hole on the vertical mounting post.

15. The stabilizer of claim 11, wherein the first front face defines a height and a width, the height being about one inch, the width being about one inch.

16. The stabilizer of claim 11, wherein the first perpendicular distance is about 3/8 inch, the second perpendicular distance is about 9/16 inch, the third perpendicular distance is about 5/8 inch, and the fourth perpendicular distance is about 7/16 inch.

* * * * *